(12) United States Patent
Sugawara et al.

(10) Patent No.: US 8,796,111 B2
(45) Date of Patent: *Aug. 5, 2014

(54) STACKED LAYERS OF NITRIDE SEMICONDUCTOR AND METHOD FOR MANUFACTURING THE SAME

(71) Applicant: Kabushiki Kaisha Toshiba, Tokyo (JP)

(72) Inventors: Hideto Sugawara, Fukuoka-ken (JP); Masaaki Onomura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/946,898

(22) Filed: Jul. 19, 2013

(65) Prior Publication Data

US 2013/0302931 A1    Nov. 14, 2013

Related U.S. Application Data

(63) Continuation of application No. 13/102,204, filed on May 6, 2011, now Pat. No. 8,502,350.

(30) Foreign Application Priority Data

Dec. 21, 2010  (JP) .................................. 2010-284523

(51) Int. Cl.
| | | |
|---|---|---|
| *H01L 21/30* | (2006.01) | |
| *H01L 33/00* | (2010.01) | |
| *H01L 21/02* | (2006.01) | |
| *H01L 29/20* | (2006.01) | |

(52) U.S. Cl.
CPC .......... *H01L 33/0025* (2013.01); *H01L 33/007* (2013.01); *H01L 21/0262* (2013.01); *H01L 21/0254* (2013.01); *H01L 21/0243* (2013.01); *H01L 29/2003* (2013.01); *H01L 21/02458* (2013.01); *H01L 21/0242* (2013.01); *H01L 21/02381* (2013.01); *H01L 21/02661* (2013.01)
USPC .......... 438/458; 438/424; 438/460; 438/478; 438/487

(58) Field of Classification Search
None
See application file for complete search history.

(56) References Cited

U.S. PATENT DOCUMENTS

| | | | |
|---|---|---|---|
| 6,015,979 A | 1/2000 | Sugiura et al. | |
| 6,316,785 B1 | 11/2001 | Nunoue et al. | |
| 8,502,350 B2 * | 8/2013 | Sugawara et al. | ............. 257/615 |
| 2006/0292833 A1 | 12/2006 | Matsushita | |

FOREIGN PATENT DOCUMENTS

| | | |
|---|---|---|
| JP | 2002-246698 | 8/2002 |
| JP | 3449358 | 7/2003 |
| JP | 2004119807 | 4/2004 |
| JP | 2007043037 | 12/2006 |
| JP | 4525894 | 6/2010 |

OTHER PUBLICATIONS

JP Office Action dated Feb. 19, 2014 received in corresponding JP Application No. 2010-284523, and an English translation thereof.

* cited by examiner

*Primary Examiner* — Kyoung Lee
(74) *Attorney, Agent, or Firm* — White & Case LLP

(57) ABSTRACT

According to one embodiment, stacked layers of a nitride semiconductor include a substrate, a single crystal layer and a nitride semiconductor layer. The substrate does not include a nitride semiconductor and has a protrusion on a major surface. The single crystal layer is provided directly on the major surface of the substrate to cover the protrusion, and includes a crack therein. The nitride semiconductor layer is provided on the single crystal layer.

20 Claims, 4 Drawing Sheets

STACKED LAYERS OF NITRIDE SEMICONDUCTOR AND METHOD FOR MANUFACTURING THE SAME

CROSS-REFERENCE TO RELATED APPLICATIONS

This application is a continuation (and claims the benefit of priority under 35 USC 120) of U.S. application Ser. No. 13/102,204, filed May 6, 2011. This application further claims benefit under 35 USC 119 of Japanese Patent Application No. 2010-284523, filed on Dec. 21, 2010. The contents of the prior applications mentioned above are incorporated herein by reference in their entirety.

FIELD

Embodiments described herein relate generally to stacked layers of nitride semiconductor and a method for manufacturing the same.

BACKGROUND

In vapor growth of a nitride semiconductor layer, a sapphire substrate is often used from a viewpoint of stability in crystal growth atmosphere and price. Since the sapphire substrate is not lattice-matched to the nitride semiconductor and has a large difference of thermal expansion coefficient from the nitride semiconductor, a number of crystal defects are easy to occur in a GaN crystal grown on the sapphire substrate. It is considered that two physical properties are related to introduction of the defects. One is strain due to the lattice constant difference between the sapphire substrate and the nitride semiconductor, and the other one is strain due to the thermal expansion coefficient difference between the substrate and a growth layer during a cooling process from a growth temperature to a room temperature.

Those strain cause warpage of the substrate after the crystal growth. The warpage of the substrate affects a following device process. In particular, in a lithography process, parallelism between a mask and the substrate has a great influence on accuracy of pattern transfer, and thus the influence of the warpage is large. Hereafter, further increase of a diameter of the substrate is possibly accelerated for reduction of the device cost, and it is considered that the warpage of the substrate is actualized as a serious problem.

DETAILED DESCRIPTION

Figure 1A:
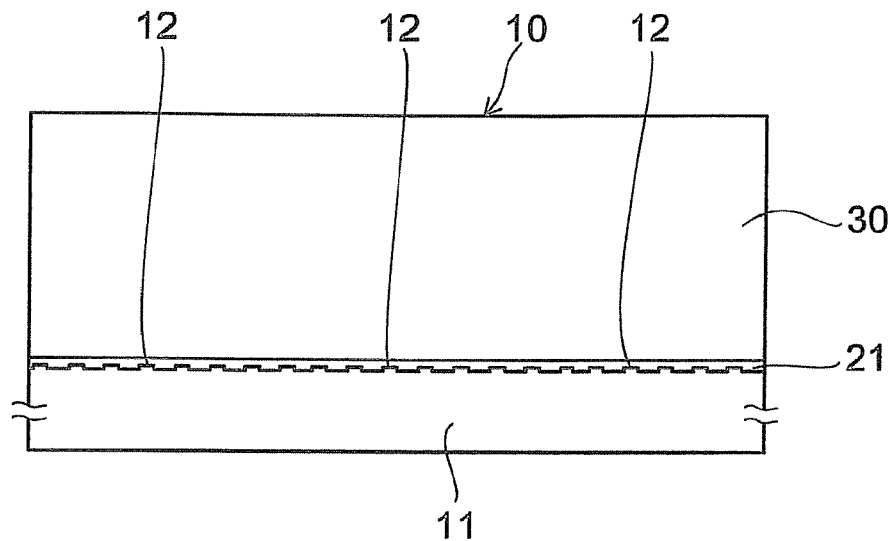
FIG. 1A is a schematic cross-sectional view of stacked layers of an embodiment.

According to one embodiment, stacked layers of a nitride semiconductor include a substrate, a single crystal layer and a nitride semiconductor layer. The substrate does not include a nitride semiconductor and has a protrusion on a major surface. The single crystal layer is provided directly on the major surface of the substrate to cover the protrusion, and includes a crack therein. The nitride semiconductor layer is provided on the single crystal layer.

Various embodiments will be described hereinafter with reference to the accompanying drawings. Elements similar to those in FIGS are marked with the same reference numerals.

Figure 1B:
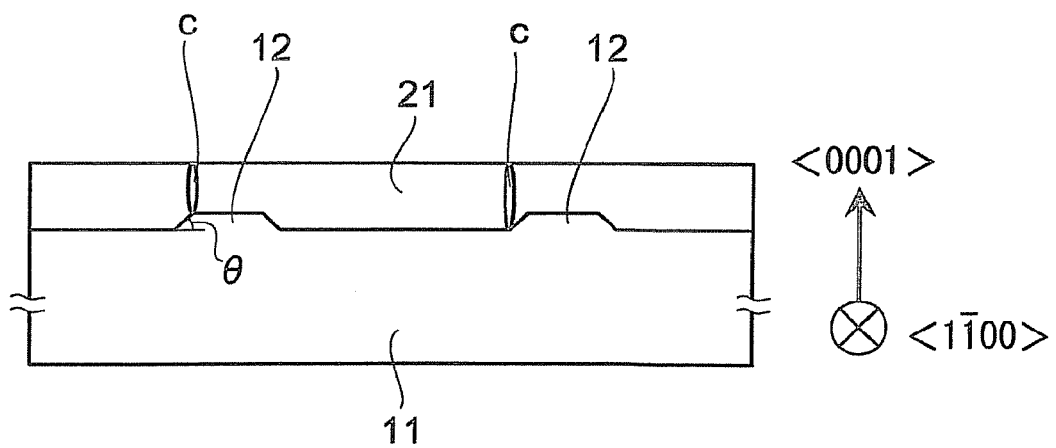
FIG. 1B is an enlarged cross-sectional view of a substrate and a single crystal layer in the stacked layers.

FIG. 1A is a schematic cross-sectional view of stacked layers 10 of an embodiment, and FIG. 1B is an enlarged cross-sectional view of a substrate 11 and a single crystal layer 21 in the stacked layers 10.

Figure 2A:
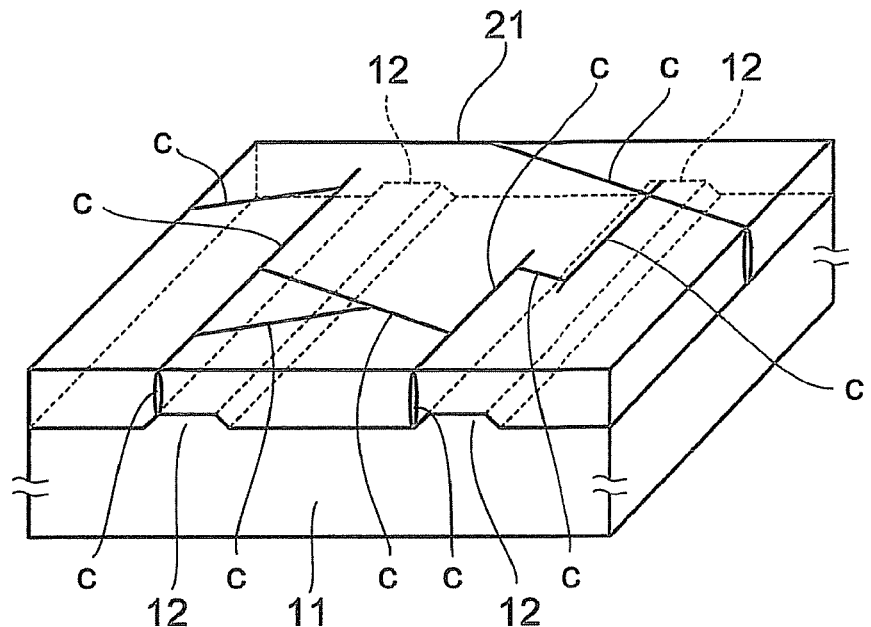
FIG. 2A is a schematic perspective view of the structure shown in FIG. 1B.
Figure 2B:
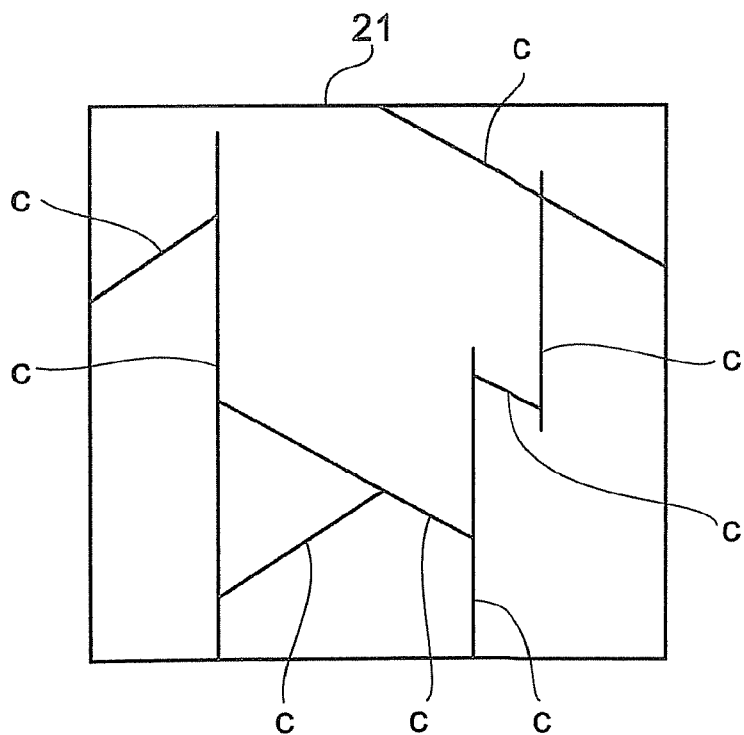
FIG. 2B is a top view of the structure.

FIG. 2A is a schematic perspective view of the structure shown in FIG. 1B, and FIG. 2B is a top view of the structure.

The stacked layers 10 of the embodiment includes a structure having a nitride semiconductor layer 30 stacked via a single crystal layer 21 on the substrate 11.

The substrate 11 is illustratively a sapphire substrate, not including nitride semiconductor. The nitride semiconductor is InAlGaN-based semiconductor. The substrate 11 can include materials not lattice-matched to the nitride semiconductor and having different thermal expansion coefficient, for example, SiC, ZnO, Si or the like other than sapphire.

FIG. 1B shows a crystal orientation of the sapphire substrate 11.

A protrusion 12 is formed on a major surface of the substrate 11. The major surface is a (0001) plane and includes a plane having an off-angle of 0 to 0.3° from the (0001) plane as well. The protrusion 12 has a tilted side surface and its cross section is formed in a trapezoid configuration. A plurality of protrusions 12 are formed in a striped plane pattern extending in <1-100> direction. Here, "-" in expression of the crystal orientation indicates an index having "-" added above "1".

The single crystal layer 21 is an $Al_xGa_{1-x}N$ ($0.8 \leq x \leq 1$) layer. For example, in the embodiment, the single crystal layer 21 is an AlN layer having an Al composition ratio x of 1.0. The single crystal layer 21 has been grown, for example, by a metal organic vapor deposition (MOCVD) method at a growth temperature of about 1200° C. directly on the major surface of the substrate 11. A film thickness of the single crystal layer 21 is, for example, 100 (nm). The single crystal layer 21 covers the side surface and a top surface of the protrusion 12. A top surface of the single crystal layer 21 is approximately flat.

The nitride semiconductor layer 30 provided on the single crystal layer 21 is illustratively a GaN single crystal layer. A film thickness of the nitride semiconductor layer 30 is 3 (μm).

Observation of the cross section of the stacked structure by a microscope allows occurrence of clack c in the single crystal layer 21 to be confirmed. It is considered that the crack c occurs when the film thickness of the single crystal layer 21 is more than a critical value corresponding to a lattice constant difference (about 11%) between the substrate (sapphire substrate) 11 and the single crystal layer (AlN layer) 21 directly grown on the major surface of the substrate 11.

As shown in FIG. 1B and FIG. 2A, the crack c (left side in FIG. 1B and FIG. 2A) has occurred on a top portion (boundary between the top surface of the protrusion 12 and the tilted side surface) of the tilted side surface of the protrusion 12. Furthermore, the crack c (right side in FIG. 1B and FIG. 2A) has occurred also on a lower portion (boundary between the major surface of the substrate 11 and the tilted side surface of the protrusion 12) of the tilted side surface of the protrusion 12.

As shown in FIGS. 2A and 2B, it can be confirmed that the crack c occurs not only in a direction (<1-100> direction of the substrate 11) of the protrusion 12 extending in a stripe pattern but also in a direction intersecting with the extending direction of the protrusion 12.

The crack c extending in the direction intersecting with the striped protrusion 12 terminates at a position of the crack c extending along the protrusion 12. The extending direction of the crack c extending in the direction intersecting with the striped protrusion 12 is a direction crystallographically equivalent to the <1-100> direction in which the protrusion 12 extends. That is, the crack c occurs in the <1-100> direction of the sapphire substrate 11 and multiple directions equivalent to it.

It can be said from these facts that the crack c in the single crystal layer 21 occurs due to the protrusion 12 formed along the prescribed crystal orientation and then the protrusion 12 controls the crack c.

That is, in the specific example such that an AlGaN layer of the single crystal layer 21 is directly grown on the (0001) plane of the sapphire substrate 11, when the protrusion 12 extending in the <1-100> direction or directions equivalent to it exists on the (0001) plane of the sapphire substrate 11, the crack c easily occurs along these directions. Positions of occurrence, density and numbers of the crack c can be controlled by adequately setting the layout, numbers, density, shape, size of the protrusion 12, the thickness, Al composition ratio of AlGaN layer or the like.

It has been found that the critical thickness of the single crystal layer 21 at which the crack c starts to occur in the single crystal layer 21 depends on the lattice constant difference between the substrate 11 and the single crystal layer 21, and the Al composition ratio x of the single crystal layer 21. According to inventor's experiments, the occurrence of the crack c is observed when the thickness of the AlGaN layer of the single crystal layer 21 increases generally more than 50 (nm). The crack c occurs notably at a film thickness of 85 (nm) or more when the Al composition ratio x of the AlGaN layer is 1.0 (AlN layer) and at 110 (nm) or more when the Al composition ratio is 0.8.

It has been found that when the Al composition ratio x is 1.0 or 0.8, cracks other than cracks extending in the above-described crystal orientation, namely cracks not due to the protrusion 12 notably occur at a film thickness of 1000 (nm) or more and the occurrence of the cracks is unable to be controlled by the protrusion 12.

Next, a method for manufacturing the stacked layers 10 of the embodiment is described.

For example, the sapphire substrate 11 with a diameter of 4 inches and a thickness of 900 ($\mu$m) is used. The multiple protrusions 12 are formed on the major surface ((0001) plane) of the sapphire substrate 11 by a dry etching method, for example, Reactive Ion Etching (RIE) or the like. Alternately, the protrusions 12 may be formed using a wet etching.

The multiple protrusions 12 are formed in a periodic and striped plane pattern. The protrusions 12 extend in the <1-100> direction of the sapphire substrate 11. In the AlGaN layer grown on the (0001) plane of the sapphire substrate 11, cracks easily occur along the <1-100> direction of the sapphire substrate 11 or the directions equivalent to it. Therefore, the protrusions 12 may be formed so as to extend in the directions equivalent to the <1-100> direction.

The protrusions 12 have a height of about 30 (nm), a width of about 1 ($\mu$m), a period of about 5 ($\mu$m), and a tilted angle of the side surface (8 in FIG. 1B) is about 60°.

The major surface of the substrate 11 having such protrusions 12 formed is subjected to cleaning treatment as necessary using a chemical solvent and then transferred into a reaction vessel via a load lock mechanism.

After thermal cleaning of the substrate 11 is performed at 1250° C. while introducing hydrogen into the reaction vessel, the temperature of the substrate is stabilized to be 1200° C. and nitrogen, ammonia and trimethylaluminum serving as aluminum source are introduced into the reaction vessel, and then the single crystal layer 21 of AlN is grown in a film thickness of 100 (nm).

The single crystal layer 21 directly grown on the sapphire substrate 11 in the embodiment is different from an amorphous layer called a so-called low temperature buffer layer grown at a temperature of, for example, about 600° C. The single crystal layer 21 is a single crystal layer grown by vapor growth at a high temperature of 1000° C. or more.

Continuously, the temperature of the substrate 11 is stabilized to be 1100° C. in an atmosphere containing hydrogen, nitrogen and ammonia, and timethylaluminum serving as gallium source is added into the reaction vessel, and then the nitride semiconductor layer 30 of GaN single crystal is grown on the single crystal layer 21 of AlN in a thickness of 3 ($\mu$m).

After the growth of this GaN layer, the temperature of the substrate 11 is lowered to a room temperature in an atmosphere excluding trimethylaluminum, and the stacked body 10 having the nitride semiconductor layer 30 stacked on the substrate 11 via the single crystal layer 21 is retrieved from the reaction vessel via the load lock mechanism.

Figure 5A:
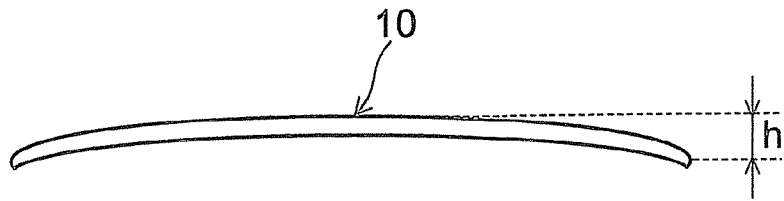
FIGS. 5A and 5B are schematic views of the stacked layers having warpage.

The wafer-like stacked layers 10 fabricated as described above may be warped as shown in FIG. 5A because of the thermal expansion coefficient difference (about 25.5%) between the substrate 11 and the nitride semiconductor layer 30 being the GaN layer. In the stacked layers 10 made of the materials described above, a center portion in a plane direction is easy to be warped in an upward convex configuration under a condition of the sapphire substrate 11 facing downward.

Here, a height between a center portion in a plane direction of the stacked layers 10 and an edge of the stacked layers is assumed to be a warpage amount h. A structure with the GaN layer directly grown on the sapphire substrate 11 without providing the single crystal layer 21 in the stacked layers 10 of the above-described embodiment is stacked layers of a comparative example. The warpage amount h is about 100 ($\mu$m) in the stacked layers of the comparative example.

In contrast, the stacked layers 10 of the embodiment has the warpage amount of about 80 ($\mu$m), the warpage amount being reduced compared with the comparative example. This is considered that the single crystal layer 21 including the crack c serves as a buffer to reduce stress mainly caused by the thermal expansion coefficient difference between the sapphire substrate 11 and the GaN layer.

Figure 5B:
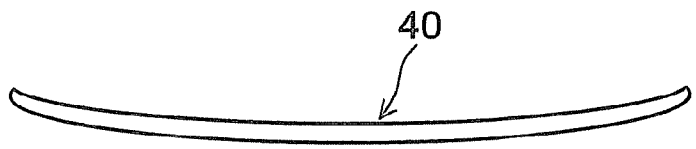

The silicon substrate may be used instead of the sapphire substrate. In the case of stacked layers 40 having the nitride semiconductor layer formed on the silicon substrate, as shown in FIG. 5B, the center portion in the plane direction is easy to be warped in a downward convex configuration under the condition of the silicon substrate facing downward. In use of the silicon substrate as well, a single crystal layer including protrusions and cracks c is formed similar to the case of the sapphire substrate and thus the warpage amount can be reduced compared with the comparative example.

When the film thickness of the single crystal layer 21 is 30 (nm) smaller than the above critical film thickness, the occurrence of cracks is not observed and the warpage amount h is 100 (μm), being the same as the comparative example. Therefore, when the film thickness of the single crystal layer 21 is set to be a film thickness more than the critical film thickness determined by the lattice constant difference to the substrate 11 and the Al composition ratio, cracks occur in the single crystal layer 21 and the warpage amount can be reduced.

The position, number, density and direction of the crack c can be controlled by the Al composition ratio of the single crystal layer 21, the number, density, shape, position, size, period or the like of the protrusions 12. Therefore, adequate design of the protrusions 12 formed on the major surface of the substrate and the Al composition ratio of the single crystal layer 21 allows the warpage amount of the stacked layers 10 to be controlled.

That is, according to the embodiment, utilizing the occurrence of the crack c due to the protrusions 12 in the single crystal layer 21 directly grown on the major surface of the substrate 11 having the protrusions 12 can relax the stress mainly caused by the thermal expansion coefficient difference between the upper nitride semiconductor layer 30 and the sapphire substrate. As a result, the warpage amount of the substrate 11 after return to a room temperature through the crystal growth at a high temperature can be reduced.

The reduction of the warpage amount of the substrate 11 facilitates following device formation on the substrate 11. For example, characteristics homogeneity in the substrate 11 can be higher in application process of various coating film, lithography process and etching process.

Figure 3A:
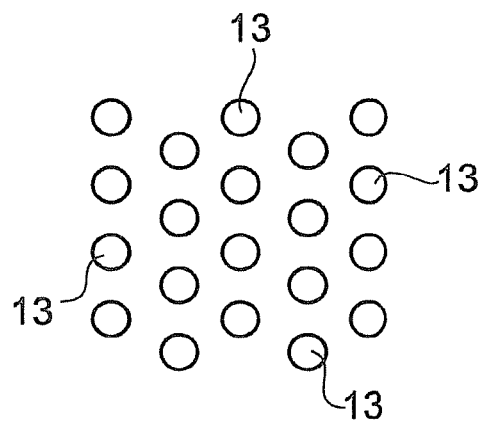
FIGS. 3A and 3B are schematic views illustrating a plane pattern example of protrusion portions formed on a major surface of the substrate in the stacked layers of the embodiment.

Planar layout of the protrusion is not limited to the stripe pattern. As shown in FIG. 3A, multiple island-like protrusions 13 may be formed on the major surface of the substrate 11. The crack extends in an arrangement direction of the protrusions 13.

One of the protrusions 13 has illustratively a circular planar shape. Alternatively, the planar shape of the protrusions 13 may be elliptical, quadrangular, triangle, polygonal or the like as well. The multiple island-like protrusions 13 are formed, for example, in an equilateral triangular planar layout with a period of 5 (μm). In the stacked layers having such protrusions 13 formed, the above-described warpage amount h can be reduced to 70 (μm) smaller than 80 (μm) of the striped protrusions 12.

The multiple island-like protrusions 13 are arranged in multiple directions in a planar view of the substrate major surface viewed from above, namely, arranged isotropically. Therefore, it is considered that the isotropic occurrence of the cracks in the substrate plane direction is possible and the stress can be scattered isotropically in the substrate plane direction. As a result, it is considered that the warpage amount h is more reduced in the stacked layers having the multiple island-like protrusions 13 formed than in the stacked layers having the striped protrusions 12 extending in only one direction.

Figure 3B:
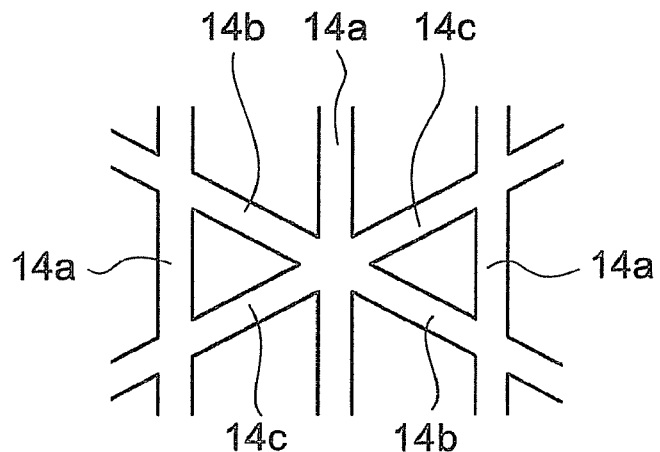

Therefore, also in the case of the striped protrusions, as shown in FIG. 3B, multiple protrusions 14a to 14c may be formed, the protrusion 14a extending in a prescribed crystal direction, the protrusions 14b and 14c extending in directions equivalent to the prescribed direction and intersecting with the prescribed direction. This may scatter the stress isotropically in the substrate plane direction and reduce the warpage amount more.

In the case where the cracks are easy to occur along the prescribed crystal orientation, when there exists the protrusions in the direction of the crystal orientation, the cracks are easy to occur along the crystal orientation, and the direction and position of extending cracks become easy to be controlled. Easy control of the cracks facilitates the design of protrusions for reducing the warpage amount.

Therefore, in the case of the striped protrusion 12, when the protrusion is formed so as to extend in the prescribed crystal orientation or the equivalent direction, the design of the protrusion for reducing the warpage amount may become easy. In the case of the island-like protrusion 13, when the multiple island-like protrusions 13 are arranged along the prescribed crystal orientation or the equivalent direction, the design of the protrusion for reducing the warpage amount may become easy.

When the protrusion has periodicity, the design of the protrusion for reducing the warpage amount may become easy based on a causal relationship between the periodicity and the crack The protrusions are not limited to the embodiment, the height, width, tilted angle of side surface, period, position or the like are optionally varied and executed. The side surface of the protrusions may be perpendicular to the major surface of the substrate 11. The protrusions may be formed in a layout having no periodicity. In any case, existence of the protrusions facilitates the occurrence of the cracks in the single crystal layer 21 at the protrusion formation position, the protrusions serving as a trigger. When the relationship between the protrusion and the crack is found, the design of the protrusions allows the occurrence of the cracks to be controlled. As a result, the warpage amount of the substrate can be reduced.

InAlGaN-based nitride semiconductor indicates optical transition of a direct transition type and high efficient radiative recombination is possible. The transition energy of the InAlGaN-based nitride semiconductor is broad to be 2 to 6.2 (eV) and thus the development is performed on the InAlGaN nitride semiconductor as a material for a high efficient light emitting device such as a Laser Diode (LD) or a high brightness visible Light Emitting Diode (LED). The band gap energy of $In_YGa_{1-Y}N$ can be varied from 3.4 (eV) of GaN to 2 (eV) of InN by varying an In composition ratio Y, and the $In_YGa_{1-Y}N$ can be used as a light emitting layer (active layer) for a visible light emitting device. A light emitting device using InGaN mixed crystal as a light emitting layer can form a white light source by combination with a fluorescent material, and can be used for a backlight of a liquid crystal and a lighting source.

Figure 4:
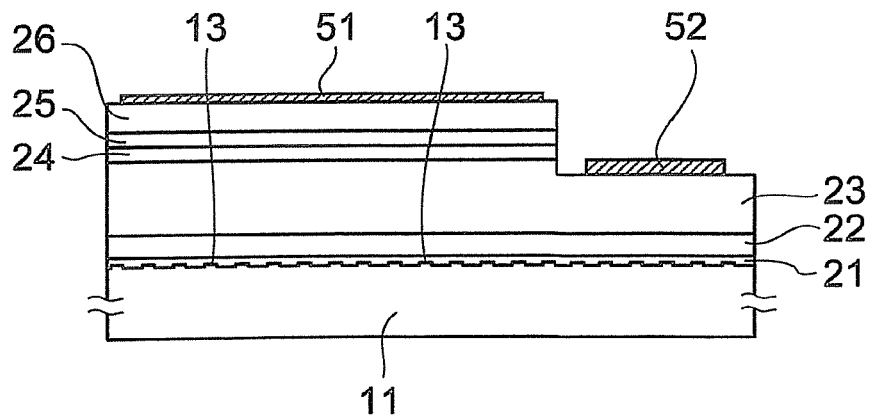
FIG. 4 is a schematic cross-sectional view of a nitride semiconductor device formed in the stacked layers of the embodiment.

FIG. 4 shows a cross-sectional structure of, for example, the LED device formed in the stacked layers of the embodiment.

The diameter of the sapphire substrate 11 is, for example, 4 inches, and a lot of LED devices are formed on the wafer-like sapphire substrate 11. FIG. 4 shows a cross-section of one of the LED devices.

The multiple island-like protrusions 13 illustratively shown in FIG. 3A are formed on the major surface of the sapphire substrate 11. A thickness of the sapphire substrate 11 is, for example, 900 (μm).

The AlN layer 21 is formed on the major surface of the sapphire substrate 11 as a single crystal layer including cracks. A thickness of the AlN layer 21 is, for example, 100 (nm).

An undoped GaN layer 22 is formed on the AlN layer 21 as an undoped layer without intentional addition of impurity. A thickness of the undoped GaN layer 22 is, for example, 500 (nm)

An n-type GaN layer 23 is formed on the undoped GaN layer 22. The n-type GaN layer 23 functions as an n-side contact layer and an n-side cladding layer. A thickness of the n-type GaN layer 23 is, for example, 3 (µm).

A light emitting layer (active layer) 24 is formed on the n-type GaN layer 23. The light emitting layer 24 has, for example, an InGaN-based multiple quantum well (MQW) structure. The light emitting layer 24 has a structure of, for example, a well layer of an $In_{0.15}Ga_{0.85}N$ with a thickness of 3 (nm) and a barrier layer of GaN with a thickness of 10 (nm) alternately stacked multiply each other.

A p-type $Al_{0.2}Ga_{0.8}N$ cladding layer 25 is formed on the light emitting layer 24. A thickness of the p-type cladding layer 25 is, for example, 10 (nm).

A p-type GaN contact layer 26 is formed on the p-type cladding layer 25. A thickness of the p-type contact layer 26 is, for example, 100 (nm).

The above-described respective layers on the sapphire substrate 11 are grown by vapor growth using an MOCVD method. Trimethylgallium, trimethylaluminum, trimethylindium, ammonia are used as growth source materials, and Bis(cyclopentadienyl)magnesium ($Cp_2Mg$) and silane ($SiH_4$) can be used as doping source materials.

A p-side electrode 51 is formed on the p-type contact layer 26. The p-side electrode 51 is electrically connected to the p-type contact layer 26 and is formed in a film form so as to transmit approximately the light from the light emitting layer 24.

A surface of a part of the n-type GaN layer 23 is exposed, and an n-side electrode 52 is formed on the exposed surface. The n-side electrode 52 is electrically connected to the n-type GaN layer 23.

After the growth of the respective layers by the above-described MOCVD method, the warpage amount h of the stacked layers retrieved from the reaction vessel has been measured to be approximately 80 (µm), and it has been found that reduction effect of the warpage amount is shown even though fabrication of the LED device.

When a bias is applied to the LED device through the p-side electrode 51 and the n-side electrode 52, light of emission wavelength of 450 (nm) is transmitted through the p-side electrode 51 and an optical output at an operation current 20 (mA) is 20 (mW). The optical output is equal to the output obtained in the structure without the AlN layer 21 including cracks, and it has been found that the LED device has no bad influence of the cracks.

Since a crack size is smaller than a wavelength as viewed from the light emitting layer 24 radiating the light, the cracks are considered to have no influence on the light transmission. A distance between the light emitting layer 24 and the AlN layer 21 is 3.5 (µm) or more and the inside of cracks is generally air and the cracks have the height of about 100 (nm).

The fact that the optical output obtained in the LED device shown in FIG. 4 is equal to that in the structure without the AlN layer 21 including cracks indicates that the cracks have no influence on dislocation increase to the upper layer as well.

Figure 6:
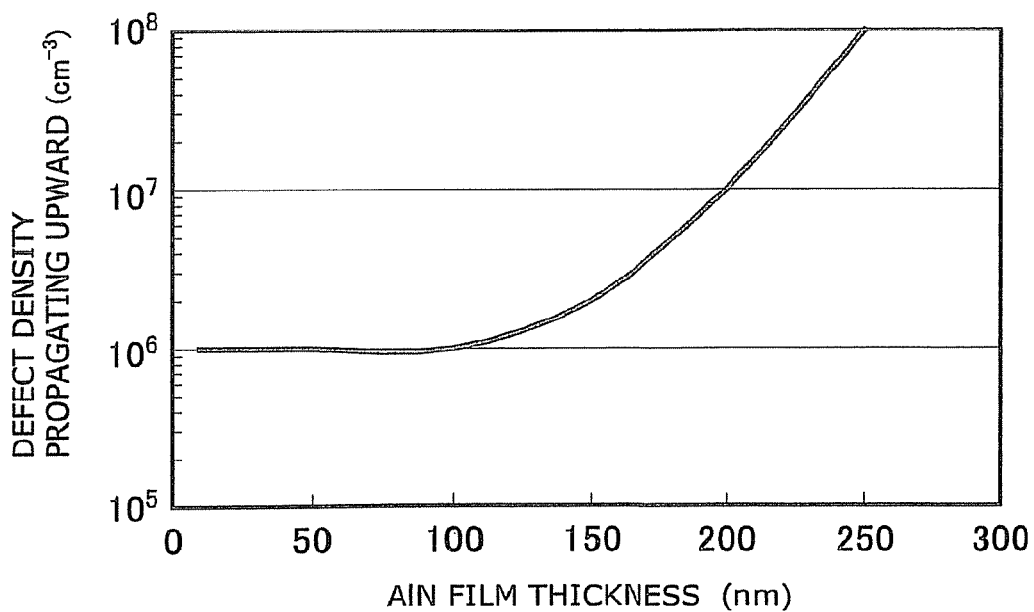
FIG. 6 is a graph illustrating the relationship between a AlN layer thickness and a defect density propagating upward.

FIG. 6 shows the relationship between a film thickness of the AlN layer and a defect density propagating upward. The horizontal axis represents the film thickness (nm) of the AlN layer, the vertical axis represents the defect density ($cm^{-3}$) propagating upward.

The cracks occur in the AlN layer with a critical film thickness of 85 (nm) or more and the defect density propagating upward increases with the following increase of the film thickness.

In the structure shown in FIG. 4, the crystal defect density in the n-type GaN layer 23 serving as a foundation layer of the light emitting layer 24 is approximately $10^8$ ($cm^{-3}$) because of the lattice constant difference and the thermal expansion coefficient difference between the sapphire substrate 11 and the layer 23.

On the other hand, as shown in FIG. 6, the defect density propagating upward considered to be due to the cracks included in the AlN layer is $10^8$ ($cm^{-3}$) or less within the film thickness of the AlN layer of about 250 (nm) or less, and is lower than the defect density of the upper layer itself.

Therefore, in the specific example such that the AlN layer is grown directly on the sapphire substrate 11, it can be said that an adequate range of the AlN layer film thickness is not less than 85 (nm) and not more than 250 (nm). That is, adequate control of the film thickness of the single crystal layer grown on the substrate while including the cracks allows the warpage of the substrate to be suppressed without influence on the characteristics of the light emitting device.

When the layer grown directly on the single crystal layer including the cracks contains impurity, it causes concern about propagation of defects due to the cracks to the upper layer. Therefore, the layer grown directly on the single crystal layer including the cracks is preferred to be an undoped layer.

The undoped layer is not limited to the above-described undoped GaN layer, but may be an undoped AlGaN layer. In the case where the AlN layer is used as the single crystal layer including the cracks, when the undoped AlGaN layer is formed thereon, defect occurrence at an interface between the AlN layer and the undoped layer can be suppressed, the defect being due to the lattice constant mismatch between the AlN layer and the undoped layer.

In propagation of the light from the light emitting layer 24, existence of the above-described undoped AlGaN layer is suitable for refractive index matching. When the undoped AlGaN layer is used as the undoped layer 22 in the LED device in FIG. 4, light of emission wavelength of 450 (nm) is transmitted through the p-side electrode 51 and an optical output at an operation current 20 (mA) is 22 (mW).

It is preferred that the layer grown directly on the single crystal layer including the cracks is formed with a flat top surface serving as an buried layer of the cracks and having no influence on the upper layer formation. For example, when a layer with magnesium added is formed directly on the single crystal layer including the cracks, lateral growth is accelerated and burying of the cracks is improved, and thus the flat top surface is easily obtained even though a relatively thin film thickness. Increase of the film thickness of the buried layer having poor contribution to the device characteristics can be suppressed and thus the cost down can be achieved.

The diameter of the sapphire substrate 11 is not limited to 4 inches. Since the influence of the warpage increases with increasing diameter of the substrate, the embodiment is effective to a substrate with a larger diameter.

The $Al_xGa_{1-x}N$ (0.8×1) layer is illustrated as the single crystal layer generating the cracks, it is sufficient that cracks producing the same effect as the above-described effect relaxing the warpage of the substrate can be caused to occur during the growth on the substrate. For example, a similar effect is also expected in a single crystal layer of InAlGaN-based crystal containing Al of 40% or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:
    forming a plurality of protrusions on a major surface of a substrate, the substrate not including a nitride semiconductor; forming a single crystal layer directly on the major surface of the substrate to cover the protrusions and to cause a crack in the single crystal layer; and forming a nitride semiconductor layer on the single crystal layer, the plurality of the protrusions being formed in a planar pattern, the protrusions extending in a prescribed crystal orientation of the substrate, and extending in a plurality of directions equivalent to the prescribed crystal orientation.

2. The method of claim 1, wherein the crack exists on a boundary between a top surface of the protrusion and a tilted side surface of the protrusion, or a boundary between the major surface of the substrate and the tilted side surface of the protrusion.

3. The method of claim 1, wherein the crack exists on at least one of a top portion of a side surface of the protrusion and lower portion of the side surface of the protrusion.

4. The method of claim 1, wherein the plurality of the protrusions are formed in a stripe pattern, and the crack extend along the one of the protrusions.

5. The method of claim 1, wherein the substrate is a sapphire substrate or a silicon substrate.

6. A method for manufacturing a semiconductor light emitting device, comprising:
    forming a plurality of protrusions on a major surface of a substrate, the substrate not including a nitride semiconductor; forming a single crystal layer directly on the major surface of the substrate to cover the protrusions and to cause a crack in the single crystal layer; and forming a nitride semiconductor layer on the single crystal layer, the plurality of the protrusions being formed in an island-like pattern, the plurality of the island-like protrusions being arranged in a prescribed crystal orientation of the substrate, and the plurality of the island-like protrusions being arranged in a plurality of directions equivalent to prescribed crystal orientation.

7. The method of claim 6, wherein the crack exists on a boundary between a top surface of the protrusion and a tilted side surface of the protrusion, or a boundary between the major surface of the substrate and the tilted side surface of the protrusion.

8. The method of claim 6, wherein the crack exists on at least one of a top portion of a side surface of the protrusion and lower portion of the side surface of the protrusion.

9. The method of claim 6, wherein the substrate is a sapphire substrate or a silicon substrate.

10. A method for manufacturing a semiconductor light emitting device, comprising:
    forming a protrusion on a major surface of a substrate, the substrate not including a nitride semiconductor;
    forming a single crystal layer directly on the major surface of the substrate to cover the protrusion and to cause a crack in the single crystal layer, the single crystal layer being an $Al_xGa_{1-x}N(0.8<x<1)$ layer; and
    forming a nitride semiconductor layer on the single crystal layer.

11. The method of claim 10, wherein the crack exists on a boundary between a top surface of the protrusion and a tilted side surface of the protrusion, or a boundary between the major surface of the substrate and the tilted side surface of the protrusion.

12. The method of claim 10, wherein the crack exists on at least one of a top portion of a side surface of the protrusion and lower portion of the side surface of the protrusion.

13. The method of claim 10, wherein a plurality of the protrusions are formed in a stripe pattern, and the crack extend along the one of the protrusions.

14. The method of claim 10, wherein the single crystal layer includes an AlN layer.

15. The method of claim 10, wherein the substrate is a sapphire substrate or a silicon substrate.

16. A method for manufacturing a semiconductor light emitting device, comprising:
    forming a protrusion on a major surface of a substrate, the substrate not including a nitride semiconductor; forming a single crystal layer directly on the major surface of the substrate to cover the protrusion and to cause a crack in the single crystal layer; and forming a nitride semiconductor layer on the single crystal layer, the nitride semiconductor layer including an undoped layer provided directly on the single crystal layer.

17. The method of claim 16, wherein the crack exists on a boundary between a top surface of the protrusion and a tilted side surface of the protrusion, or a boundary between the major surface of the substrate and the tilted side surface of the protrusion.

18. The method of claim 16, wherein the crack exists on at least one of a top portion of a side surface of the protrusion and lower portion of the side surface of the protrusion.

19. The method of claim 16, wherein a plurality of the protrusions are formed in a stripe pattern, and the crack extend along the one of the protrusions.

20. The method of claim 16, wherein the substrate is a sapphire substrate or a silicon substrate.

* * * * *